US008203472B2

(12) United States Patent
Robinson

(10) Patent No.: US 8,203,472 B2
(45) Date of Patent: Jun. 19, 2012

(54) COMPENSATION OF CLOCK JITTER IN ANALOG-DIGITAL CONVERTER APPLICATIONS

(75) Inventor: Ian S. Robinson, Redondo Beach, CA (US)

(73) Assignee: Raytheon Company, Waltham, MA (US)

(*) Notice: Subject to any disclaimer, the term of this patent is extended or adjusted under 35 U.S.C. 154(b) by 39 days.

(21) Appl. No.: 12/886,137

(22) Filed: Sep. 20, 2010

(65) Prior Publication Data

US 2012/0068866 A1 Mar. 22, 2012

(51) Int. Cl.
H03M 1/06 (2006.01)
(52) U.S. Cl. ........................................ 341/118; 341/155
(58) Field of Classification Search .................. 341/118, 341/155
See application file for complete search history.

(56) References Cited

U.S. PATENT DOCUMENTS

| | | | |
|---|---|---|---|
| 5,757,652 A | 5/1998 | Blazo et al. | |
| 6,232,905 B1 * | 5/2001 | Smith et al. ................ | 341/155 |
| 6,240,130 B1 | 5/2001 | Burns et al. | |
| 6,356,569 B1 | 3/2002 | Sonalkar et al. | |
| 6,593,871 B1 * | 7/2003 | Miethig et al. ............. | 341/157 |
| 7,262,723 B2 | 8/2007 | Straussnig et al. | |
| 7,492,300 B2 | 2/2009 | Suyama | |
| 7,576,666 B2 | 8/2009 | Mayrench et al. | |
| 7,671,773 B2 | 3/2010 | Ceballos | |
| 7,688,242 B2 * | 3/2010 | Shimizu et al. ............ | 341/155 |
| 2007/0042721 A1 | 2/2007 | Gupta et al. | |

OTHER PUBLICATIONS

Derek Redmayne (LTC Applications Engineer), Eric Trelewicz (LTD Applications Manager), and Alison Smith (High Speed ADC Product Marketing Engineer), Design Notes, "Understanding the Effect of Clock Jitter on High Speed ADCs", Design Note 1013, 2006, Linear Technology Corporation, Milpitas, CA, 4pages.
E2V Semiconductors SAS 2007, "High-speed ADC Input Clock Issues" Application Note, Jun. 2007, E2V, pp. 1-20, e2v Inc., Elmsford, NY.
Walt Kester, "Aperture Time, Aperture Jitter, Aperture Delay Time—Removing the Confusion", MT-007 Tutorial, Analog Devices. pp. 1-8, 2009, Analog Devices, Inc.
James Catt, "Clocking High-Speed A/D Converters", Application Note 1558, pp. 1-4, Jan. 2007, 2007 National Semiconductor Corporation.
National Semiconductor, LMK04000 Family Low-Noise Clock Jitter Cleaner with Cascaded PLLs, pp. 1-54, Jul. 24, 2009, 2009 National Semiconductor Corporation.
Joerger Enterprises, Inc. "VME" Dual Channel, High Performance, 125Mhz., 16 BIT ADC Daughter Board, Model ADC 125/16, Mar. 20, 2008 Joerger Enterprises, Inc. Centerport. NY, 3 pages.

(Continued)

*Primary Examiner* — Khai M Nguyen
(74) *Attorney, Agent, or Firm* — Pierce Atwood LLP; Joseph M. Maraia, Esq.

(57) ABSTRACT

Processes and systems for use in reducing clock jitter-induced error, obtain a first sample during each cycle of a periodic analog reference signal. The sample includes an error resulting at least in part from jitter-induced timing error of the clock signal. For each respective cycle, a second sample of a discrete-time analog representation of the periodic analog reference signal is also obtained. The second sample is substantially unsusceptible to jitter-induced timing error of the clock signal. Each of the first and second samples corresponds to the same respective cycle of the clock signal. For each cycle, a respective difference between each of the first and second samples is determined. The difference is indicative of timing error of the respective cycle of the clock signal. The difference is converted to a digital representation that can be used to compensate for jitter-induced error.

20 Claims, 10 Drawing Sheets

OTHER PUBLICATIONS

Paul Jones, Tanja Hofner, "Design Challenges for an Ultra-Low Jitter Clock Synthesizer", Application Note 4336, pp. 1-8, Dec. 23, 2008, Maxim Integrated Products.

J.B. Schlager, Senior Member, IEEE, B.E. Callicoatt, R. P. Mirin, Member, IEEE, and N.A. Sanford, Passively Mode-Locked Waveguide Laser With Low Residual Jitter, IEEE Photonics Technology Letters, vol. 14, No. 9, Sep. 2002. Publisher Item Identifier 10.1109/LPT.2002.801123, 3pages.

Wenzel Associates, "Ultra Low Phase Noise 200 MHz to 12 GHz Multiplied Crystal Oscillators: Introduction to a series of multiplied crystal oscillators for users of high quality frequency sources from VHF to X-band," Oct. 9, 2009 Issue, 2009 Microwave Journal & Horizon House Publications, 4pages.

Walt Kester, "Converting Oscillator Phase Noise to Time Jitter", pp. 1-10, MT-008, 2009, Analog Devices, Inc.

Bill Odom, Applications Engineer, National Semiconductor Corp. "Understanding analog/digital converter clock jitter—and why you should care", pp. 1-5, [online] Dec. 17, 2007, [retrieved on Oct. 12, 2009]. Retrieved from the Internet <URL:http://www.planetanalog. com/article/printableArticle.jhtml; jsessionid= T5X5PL1RKQ1DRQE1GHPSSK . . . .

Matt Park, Jung-Won Kim, Franz Kaertner, Michael Perrott, Microsystems Technology Laboratories Research Laboratory of Electronics Massachusetts Institute of Technology, "An Optical-Electrical Sub-Sampling Receiver Employing Continuous-Time [Delta-Sigma] Modulation", 2006 IEEE, pp. 182-186.

Maxim, "Low-Jitter Frequency Synthesizer with Selectable Input Reference", pp. 1-16, MAX3671, 2009 Maxim Integrated Products, Sunnyvale, CA.

Maxim, "Design a Low-Jitter Clock for High-Speed Data Converters", Application Note 800, Nov. 20, 2001, Maxim Integrated Products, 12pages.

Intersil, "14-Bit, 250/210/170/125MSPS ADC", KAD5514P, pp. 1-34, Sep. 10, 2009, Intersil Americas, Inc.

Derek Redmayne, Alison Steer, Linear Technology Corp. "Effect of clock jitter on high-speed ADCs", pp. 1-2, Analogue-to-digital conversion, eetindia.com, EE Times-India.

Xu et al.; A 2.4-GHz Low-Power All Digital Phase-Locked Loop; IEEE Journal of Solid-State Circuits; vol. 45; No. 8 pp. 1513-1521; Aug. 2010.

* cited by examiner

COMPENSATION OF CLOCK JITTER IN ANALOG-DIGITAL CONVERTER APPLICATIONS

TECHNICAL FIELD

Various embodiments are described herein relating generally to analog/digital conversion and the like and more particularly to clock jitter-induced error measurement and compensation during analog-to-digital conversion.

BACKGROUND

Clock timing jitter can be a limiting factor in high performance Analog-to-Digital Converters (ADCs). ADCs typically include a module or circuit that periodically samples an analog input signal according to a timing or clock signal. Jitter, as discussed herein, generally relates to errors resulting from a departure from a precisely periodic sample time/interval. Such errors result from jitter that occurs in both the module that samples signals (aperture jitter) and in the clock signal itself (clock jitter).

Jitter is a random process that results in variations in the spacing of sampled pulses within an ADC. The digital reconstruction of signals captured by ADCs assumes uniform sampling in time, such that when there is non-uniform sampling, noise-like errors are introduced into the digital signal stream. ADCs commercially available for use in high-speed applications, such as Radio Frequency (RF) receivers, are limited in dynamic range to such an extent by timing jitter, that it constrains the overall receiver capability.

One measure of quality of ADCs is referred to as an Effective Number of Bits (ENOB). The resolution of an ADC is commonly specified by the number of bits used to represent the analog value, in principle giving $2^N$ signal levels for any N-bit signal. The value of ENOB specifies the number of bits in the digitized signal above the noise floor. FIG. 1A and FIG. 1B show relationship of ENOB obtainable for ADCs as a function of their maximum sample rate ($f_s$) and the timing jitter ($\sigma_j$). Unless otherwise noted, clock or timing jitter levels described herein are root-mean-square (RMS) values. FIG. 2 shows similar constraints, expressing dynamic range in decibels (dB). In the 1990s and early 2000s it was not uncommon for total jitter to have RMS jitter value of above 1 picosecond (ps). A jitter value of 1 ps limits a 10-bit ADC to a maximum conversion rate of around 100 MHz. Each reduction in jitter by a factor of two enables either a factor of two, higher conversion rate or an additional ENOB.

The total timing jitter is the root-sum-square combination of clock jitter and aperture jitter. An article by R. H. Walden, entitled "Analog-to-Digital Conversion in the Early 21st Century," published in the IEEE MTT Workshop on Ultrafast Analog-to-Digital (A/D) Conversion Techniques and its Applications, 5 (2007), reports that aperture jitter has been reduced below a value of 100 ps for high end components as of 2006. Table 1 shows values for aperture jitter found in the literature for high end commercial ADCs from companies including Texas Instruments and Analog Devices. The table shows that 60-80 femtoseconds (fs) is a state-of the art value. Walden predicts aperture jitter will reach 25 fs for electronic sampling circuits.

TABLE I

Representative Aperture Jitter

| Aperture Jitter (fs) | Reference |
|---|---|
| 70 (140 MSPS system) | Linear Technology, *Understanding the Effect of Clock Jitter on High Speed ADCs*-Design Note 1013, Derek Redmayne (LTC Applications Engineer), et al. |
| 60 (125 MSPS, 14 bit) | Analog Devices, MT-007 TUTORIAL, *Aperture Time, Aperture Jitter, Aperture Delay Time-Removing the Confusion* by Walt Kester. |
| 25 (predicted in near future) | R. H. Walden, Analog-to-Digital Conversion in the Early 21st Century, in *IEEE MTT Workshop on Ultrafast Analog-to-Digital A/D) Conversion (Techniques and its Applications*, 5 (2007). |
| 80 (135 MSPS, 16 bit) | Texas Instruments, *Optimizing ADC SNR by Reducing Sampling Jitter with Proper Clocking Design*, By Lin Wu, September 2009 http://www.wirelessdesignasia.com/. |
| 60 (100 MSPS, 16 bit) | Analog Devices, MT-007 TUTORIAL, *Aperture Time, Aperture Jitter, Aperture Delay Time-Removing the Confusion* by Walt Kester. |
| <10 (Optical) | Alan M. Braun et al, Compact, high-power, low-jitter, semiconductor modelocked laser module for photonic A/D converter applications, Enabling Photonic Technologies for Aerospace Applications V, Andrew R. Pirich, et al, Eds, Proc of SPIE Vol. 5104 (2003). |

Clock jitter is highly dependent on the type of oscillator (a reference source to a timing or clock circuit), the frequency of the oscillator, whether it is a sinusoid or a square wave, etc., and whether it is for a fixed-frequency or a variable-rate clock. Fixed frequency oscillators providing sinusoidal signals, such as crystal oscillators, have demonstrated the lowest timing jitter available in the literature. Unfortunately these sources are limited to frequencies below about 200 MHz. Higher frequency clocks and variable speed clocks are typically based on Phase-Lock Loop (PLL) circuits, such as the one shown in FIG. 3. Square wave clocks appear to have more jitter than sinusoidal clocks but the sampling circuits have lower aperture jitter.

The PLL circuit shown in FIG. 3 is representative of a typical timing circuit 100. The input periodic reference ($F_{REF}$) is generally of a lower frequency with relatively less jitter than the periodic output signal ($F_{CLK}$). As the frequency of the output high-speed clock signal $F_{CLK}$ increases, so does the clock jitter. The PLL circuit 100 maintains a phase relationship between the high-frequency clock output signal and the input reference signal. Since the frequencies of the two singles differ some form of scaling is generally provided before phases of the two signals are compared by a phase comparator 102. As shown, the reference signal is divided by a first value, M in an input scaler 104. The output signal is divided by a second value, N, in an output pre-scaler 106, such that the periods of the scaled input and output signals are substantially equivalent. Phases of the two scaled signals are compared at the phase detector 102, which provides an output signal indicative of a phase offset between the two signals. The output of the phase detector can be filtered by a loop filter 108, as shown. The filtered output phase difference signal can be used to drive a voltage controlled oscillator 110 providing a high frequency of the signal phase locked to the input reference signal. In this example, voltage controlled oscillator output is further divided by a factor of two in a post-scaler 112 to provide an output clock signal at the desired clock frequency.

Oscillators are characterized by their phase noise, which is generally very high at frequencies within tens of kilohertz of the center frequency and abates at more distant frequencies. It hits a thermal noise floor at more distant offset frequencies. The integrated phase noise can be converted to timing jitter, for example, as described in Analog Devices publication MT-008, entitled "Converting Oscillator Phase Noise to Time Jitter," by Walt Kester, October 2008.

Table 2 shows clock jitter levels of 200-450 fs for high-performance clocks found in the literature from manufacturers of ADC components and boards. All of these clocks ran at rates at or below 1 GHz. The clock described in Ref 3 was exactly 1 GHz and has the largest jitter at 450 fs.

TABLE 2

Representative Clock Jitter

| Clock Jitter (fs) | Reference |
|---|---|
| 300 | Joeger Enterprises, MODEL ADC 125/16 "VME" DUAL CHANNEL, HIGH PERFORMANCE, 125Mhz, 16 BIT ADC DAUGHTER BOARD. |
| 401 | National Semiconductor, Clocking High-Speed A/D Converters, App Note 1558. James Cali. January 2007. |
| 192 | National Semiconductor, LMK04000 Family, Low-Noise Clock Jitter Cleaner with Cascaded PLLs, Jul. 24, 2009. |
| 450 | E2V, High-Speed ADC Input Clock Issues-Application Note. |
| 200 | MAXIM, Design Challenges for an Ultra-Low-Jitter Clock Synthesizer-APPLICATION NOTE 4336, By: Paul Jones, Tanja Hofner, Dec. 23, 2008. |
| 10-100, optical | (i) J. B. Schlager, Senior Member, IEEE, et al, Passively Mode-Locked Waveguide Laser With Low Residual Jitter, IEEE PHOT TECHNOLOGY LET, SEPTEMBER 2002. (ii) Alan M. Braun et al, Compact, high-power, low-jitter, semiconductor modelocked laser module for photonic A/D converter applications, Enabling Photonic Technologies for Aerospace Applications V, Andrew R. Pirich, et al , Eds, Proc of SPIE Vol. 5104 (2003). (iii) George C. Valley et al, Photonic analog-to-digital converters: fundamental and practical limits, Integrated Optical Devices, Nanostructures, and Displays, SPIE Volume: 5618, Keith Lewis Ed., November 2004. |

Descriptions of oscillators and PLL-based clocks with the lowest phase noises at frequencies of about 100 MHz to about 12 GHz that the inventor could find in the open literature at the time of filing are described in "Ultra Low Phase Noise 200 MHz to 12 GHz Multiplied Crystal Oscillators," Microwave Journal, Oct. 1, 2009, by Wenzel Associates, with additional listings available online at www.wenzel.com contain. A 2 GHz clock with about 450 fs of jitter is available from Wenzel Associates, Inc. of Austin, Tex. It is derived from a 100 MHz input (e.g., from a crystal oscillator) with about 70 fs of jitter. In the conversion process from the 100 MHz reference to the 2 GHz output frequency, there are several stages of multiplication and filtering, for example, one stage providing a 200 MHz signal with about 100 fs of RMS jitter. Table 3 provides conversion of the reported phase noise levels, via known formulas (e.g., see Analog Devices, "MT-008: Converting Oscillator Phase Noise to Time Jitter," by Walt Kester, October 2008), into clock jitter. Table 3 also shows a corresponding limit of ADC performance (e.g., jitter-limited ENOB) due to the associated jitter for a maximum sample rate at half the given clock rate.

TABLE 3

Low Timing Jitter Clocks

| CLK (MHz) | Max Sample Rate (MHz) | JITTER (Sec) | SNR JITTER | Jitter-Limited ENOB |
|---|---|---|---|---|
| 8000 | 4000 | 1.1E−12 | 31 | 5.1 |
| 5120 | 2560 | 8.9E−13 | 37 | 6.1 |
| 2560 | 1280 | 5.6E−13 | 47 | 7.8 |
| 2000 | 1000 | 4.5E−13 | 51 | 8.5 |
| 1000 | 500 | 2.8E−13 | 61 | 10.1 |
| 500 | 250 | 2.0E−13 | 70 | 11.6 |
| 200 | 100 | 1.0E−13 | 84 | 14.0 |
| 100 | 50 | 7.1E−14 | 93 | 15.5 |

As shown in Table 3, jitter values range from 70 fs for a 100 MHz crystal oscillator to more than 1 ps for an 8 GHz clock. Several multiplication stages upconvert the 100 MHz or other reference to the final high-speed clock. The ENOB levels drop quite substantially from 15.5 bits to 5 bits across this range of frequencies. As described above, the total jitter levels for an ADC include aperture jitter (nominally 70 fs) added in quadrature to clock jitter.

Thus, higher speed clocks are susceptible to jitter that severely impacts ADC dynamic range. For example, reducing the impact of clock jitter by a factor of eight will add three ENOBs for ADCs. At lower clock rates such reductions will provide ENOB benefits until the limit of aperture jitter is reached.

SUMMARY

Described herein are embodiments of systems and techniques for measuring the clock timing at much finer gradations than the clock jitter levels.

In one aspect, at least one embodiment described herein supports a process for use in reducing clock jitter-induced error. At each cycle of a clock signal, a first sample of a periodic analog reference signal is obtained. The first sample includes a sample error resulting at least in part from jitter-induced timing error of the clock signal. For each respective cycle of the clock signal a second sample of a discrete-time analog representation of the periodic analog reference signal is obtained. The second sample is substantially unsusceptible to jitter-induced timing error of the clock signal because it is already a discrete signal. Each of the first and second samples corresponds to the same respective cycle of the clock signal. For each cycle of the clock signal a respective difference between each of the first and second samples is determined. The difference is indicative of timing error of the respective cycle of the clock signal. The difference is next converted to a digital representation.

In another aspect, at least one embodiment described herein relates to a system for reducing clock jitter-induced error. The system includes a sample-and-hold module configured to receive a periodic analog reference signal and a clock signal. The clock signal has periods of successive clock cycles that vary according to clock jitter. The sample-and-hold module is configured to provide an output signal representative of the periodic analog reference signal sampled according to the clock signal. The system further includes a numerically controlled oscillator configured to receive the same clock signal and to provide for each cycle of the clock signal a respective digital representation of the periodic analog reference signal, sampled according to the clock signal. A digital-to-analog converter is provided in electrical communication with the numerically controlled oscillator. The digital-to-analog converter is configured to provide a respective analog output value responsive to each respective digital representation of the periodic analog reference signal. The system further includes a difference module in electrical communication with the sample-and-hold module and the digital-to-analog converter. The difference module is configured to determine for each cycle of the clock signal, a respective difference between each of the sampled-and-held output signal and the analog output value. An analog-to-digital converter is provided in electrical communication with the difference module and the clock signal. The analog-to-digital converter is configured to convert each respective difference to a digital representation of the difference. The digitized result is indicative of timing error of the respective cycle of the clock signal.

In yet another aspect, at least one embodiment described herein supports a system for use in reducing clock jitter-induced error. The system includes means for obtaining at each cycle of a clock signal, a first sample of a periodic analog reference signal. The first sample includes a sample error resulting at least in part from jitter-induced timing error of the clock signal. The system also includes means for obtaining for each respective cycle of the clock signal a second sample of a discrete-time analog representation of the periodic analog reference signal. The second sample is substantially unsusceptible to jitter-induced timing error of the clock signal. Each of the first and second samples corresponds to the same respective cycle of the clock signal. Also provided are means for determining for each cycle of the clock signal a respective difference between each of the first and second samples, and means for converting the difference to a digital representation of the difference indicative of timing error of the respective cycle of the clock signal, the sample error.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

A description of preferred embodiments of the invention follows.

Figure 4:
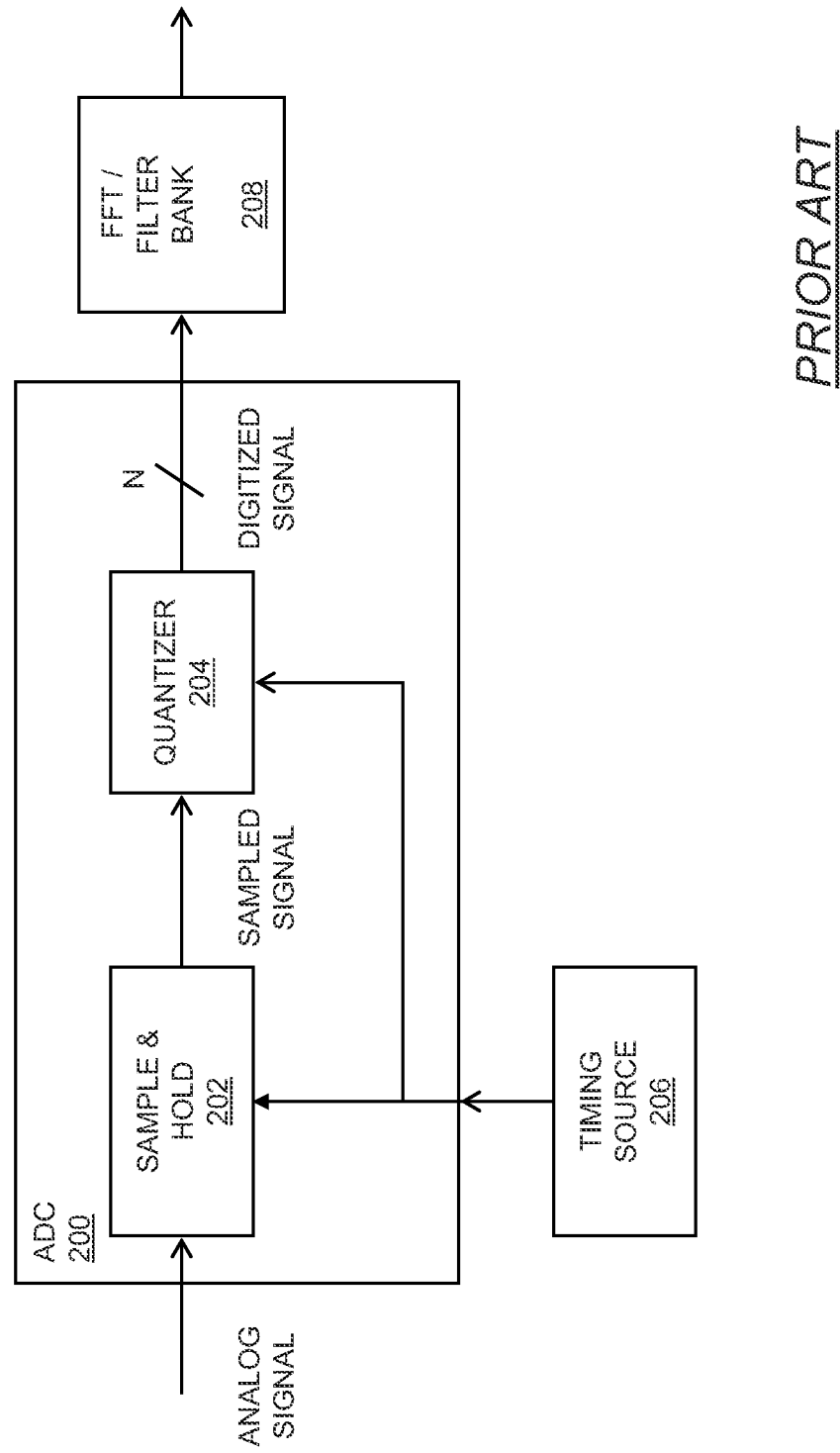
FIG. 4 illustrates a functional block diagram of an example of a prior art, uncompensated ADC in combination with a filter bank.

FIG. 4 shows a functional block diagram of a prior art ADC 200 containing a sample-and-hold module 202, a quantizer 204, and a timing source 206. The sample-and-hold module 202 receives an analog input signal (e.g., a time varying voltage or current) and a timing signal, for example, from the timing source 206. The timing signal can be any suitable, generally periodic signal, having a waveform shape that is sinusoidal, rectangular, square, triangular, etc. The timing signal can be unipolar or bipolar, e.g., varying about a reference (e.g., 0 Volts). The sample-and-hold module 202 periodically samples the analog input signal according to the timing signal. The amplitude of the analog input signal the sample at the instant of sampling $t_i$, the sample, $S(t_i)$, is held at a substantially constant value until the next sample instant. Each sampled analog value $S(t_i)$ is quantized and converted to a representative numerical representation, e.g., a digital word $S_k$, by the quantizer 204. As a result of quantization, the digital word corresponds to one of a finite number of predetermined values, for example, corresponding to one value closest to the analog value of the sampled input. For example, an 8-bit digital word may take on up to $2^8$ or 64 distinct values selected to span the range of magnitudes of the sampled analog signal. New N-bit digital words are similarly provided for subsequent samples according to the timing signal, resulting in a digitized time domain output signal representative of the analog input signal.

In the presence of timing jitter in the timing signal, significant errors in the digitized signal can result. Namely, timing jitter can lead to errors in digital signals because the digital processing and/or digital reconstruction used in virtually all applications assumes that the analog signal is sampled using a precisely periodic timing signal. The presumption is that spacing between digital words of a representative digitized signal is uniform. For an ideal timing signal without jitter, this would be the case. However, jitter results in some sample-to-sample variation within the ADC 200, which results in a non-uniform spacing between samples.

Further processing of the digitized signal based on such a false assumption will generally result in errors. For example, in many Radio Frequency (RF) receivers, the digitized signals are immediately transmitted to a processor (hardware or software) that measures the amplitude and/or phase of one or more frequencies. Such processing can be accomplished in a channelizer or filter bank 208 as shown in FIG. 4. For example, each of a number of uniformly spaced filters processes a respective portion of a signal spectrum (sub-band), for example, determining a respective phase and amplitude of the digitized signal within the respective sub-band. One example of such a filter bank is a spectrum analyzer including a number of uniformly spaced filters (e.g., 1,024 filters), each processing a respective sub-band and collectively providing a frequency spectrum of the input signal. Some applications can include processing techniques known to those skilled in the art as Fast Fourier Transforms (FFT), Discrete Fourier Transforms (DFT), and the like.

Figure 5:
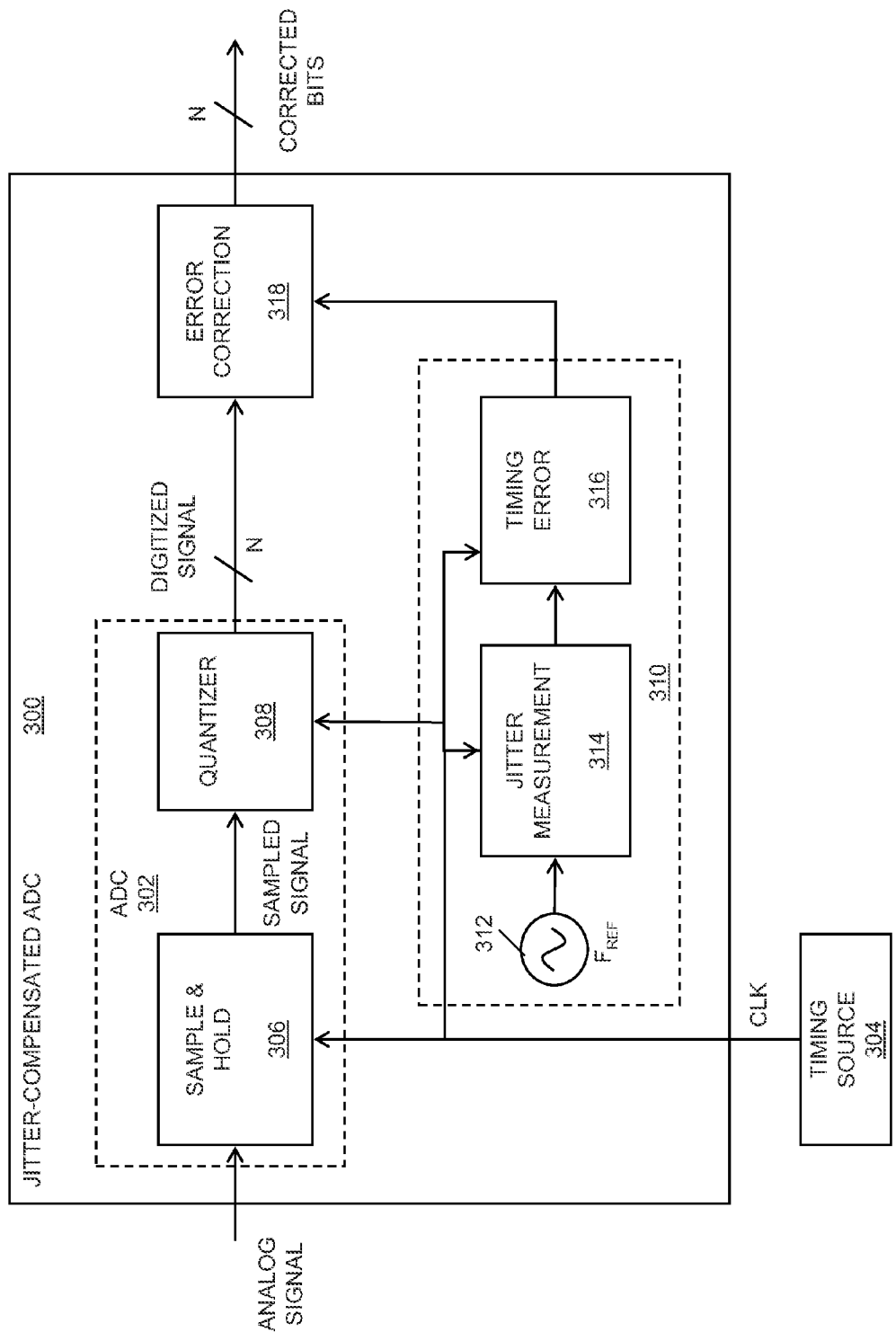
FIG. 5 illustrates a functional block diagram of a particular embodiment of a jitter-compensated ADC that includes means for interpolation/reconstruction of the digitized signal.

FIG. 5 illustrates an example of an improved jitter-compensated ADC 300. In this example, the jitter-compensated ADC 300 includes a typical ADC 302, e.g., including a sample-and-hold module 306 and quantizer 308, such as the one shown and described in reference to FIG. 4. The ADC 302 samples the analog signal responsive to a periodic sampling or clock signal CLK provided by a timing source 304. The clock signal is relatively high-speed and in any physical realization, generally includes jitter resulting in variation of the sample-to-sample period used to by the ADC 302 to sample the analog input signal. The jitter-compensated ADC 300 also includes a jitter error detection module 310 configured to determine a measure of the timing error or actual jittered timing of the high-speed clock signal (e.g., of the actual clock pulses).

In the example embodiment, the jitter error detection module 310 receives the high-speed clock signal from the timing source 304 and is configured to generate an "error signal" related to the actual timing employed. The jitter error detection module 310 includes a jitter error measurement module 314, a reference source 312, and a timing error conversion module 316. The jitter error measurement module 314 receives the "jittery" high-speed clock signal from the timing source 304 and a periodic reference signal $F_{REF}$ from the reference source 312. Preferably, the reference source 312 signal $F_{REF}$ is relatively jitter free—e.g., having substantially less jitter than the high-speed clock signal. The jitter error measurement module 314 determines a measure of the jitter in the high-speed clock signal.

In some embodiments, the jitter error measurement module 314 determines a jitter-induced error in the reference signal sampled by the high-speed clock signal. The timing error conversion module 316 receives the measure of the jitter (e.g., the jitter-induced error of the sampled amplitude of the reference signal) from the jitter error measurement module 314. The timing error conversion module 316, in turn, is configured to convert the jitter-induced error (i.e., amplitude error) of each sample to a corresponding jitter timing error value. The timing error value of the $i^{th}$ sample ($\Delta t_i$) in combination with the ideal or expected timing of the corresponding high-speed clock cycle ($t_i$) is indicative of a best estimate of the actual sample time $t'_i$ ($t'_i = t_i + \Delta t_i$).

In at least one example, the jitter error measurement module 314 provides an output indicative of a jitter-induced error due to the high-speed clock signal, that is regularly updated for each cycle of the clock signal. In some embodiments, the periodic reference signal is sampled by the high-speed clock signal. The jitter-induced error can be representative of an amplitude difference of a particular sample of the reference signal $F_{REF}$ obtained by the high-speed clock signal with respect to a sample of the same reference signal $F_{REF}$ that would have been obtained by a relatively "clean" or "jitter-free" (i.e., ideal) high-speed clock signal. In some embodiments, the jitter error measurement module 314 provides an analog value indicative of the amplitude difference or error thus obtained (e.g., a voltage or current value indicative of the amplitude difference). Alternatively or in addition, the jitter error measurement module 314 provides a digitized representation of the amplitude error.

In the illustrative example, the timing error conversion module 316 converts output of the jitter error measurement module 314 (i.e., jitter-induced amplitude error) to corresponding timing error values or levels. In at least some embodiments, the timing error conversion module 316 determines for each jitter-induced amplitude error an estimate of the actual sample time for each successive output. In at least some embodiments, the timing error conversion module 316 estimates the timing error from the amplitude error. Such a conversion can be accomplished, for example, by a look-up table. A look-up table can be determined from a relationship between amplitude error and the timing error. In some examples, this relationship can be approximated by a straight line. The slope of such a straight line can be estimated analytically or empirically for a particular embodiment.

The resulting estimates of actual sample times determined from the amplitude error offer an improvement over the actual sample times, but generally include a residual error. At least one contributor to residual error relates to a slew rate of the signal at the time of a given sample. The amplitude error fluctuates according to the slew rate. With knowledge of the slew rate, it would be possible to much more precisely estimate the timing error. Unfortunately, it is not possible to determine the slew rate from the amplitude error alone. Such information can be obtained, however, or at least estimated, from the reference signal. For example, a look-up table stores a representation of at least one cycle or period of the reference signal $F_{REF}$ (e.g., amplitude versus time). In some embodiments, the timing error conversion module 316 also receives the sample value, which allows for an approximation of where the particular sample falls with respect to the representation stored in the lookup table. The timing error value can be determined or otherwise estimated from the amplitude variation of the particular sample of the reference signal. For example, in some embodiments, the timing error can be interpolated from stored values. Alternatively or in addition, the timing error can be estimated from the slew rate of the stored reference. Such a timing error or offset can be used alone or combined with an assumed jitter-free sample time to determine or otherwise estimate the actual sample time. The output of the timing error conversion module 316, whether the timing error (jitter) or actual sample time can be provided in an analog form, or as a digitized word.

In at least some embodiments, the jitter compensated ADC 300 includes an error correction module 318 configured to correct the digital signal or to otherwise correctly reconstruct a replica of the sampled analog signal, for example, via interpolation of the digitized signal. Such an error correction module 318 receives the digitized output of the uncompensated ADC 302 along with a signal indicative of the jitter error or actual sample time of the jittery high-speed clock.

In the example, the error correction module 318 receives the digital output signal of the conventional ADC 302 and from the jitter error detection module 310, a measure of the timing error associated with the digitized signal. The error correction module 318 adjusts digitized output signal of the ADC 302 according to the actual sample times, thereby compensating the digitized output signal of the ADC 302 for any jitter introduced by variations in the actual sample time from an ideal sample time. Thus, the output of the error correction, or reconstruction module 318 is an estimate of what the digitized signal output of the ADC 302 would have been had it resulted from precise periodic timing (i.e., had the high-speed clock not been susceptible to jitter).

In more detail, the error correction module 318 receives updated timing error values from the jitter error detection module 310 for each sample, (e.g., actual sample times $t'_i$). The error correction module 318, in turn, corrects the digital signal received from the quantizer 308 of the uncompensated ADC 302 (e.g., each uncompensated N-bit digital word corresponding to the $i^{th}$ sample) to corrected values. Namely, the error correction module 318 compensates the digital output signal providing N-bit digital words indicative of the analog input signal as if it had been sampled according to the presumed uniformly spaced (i.e., ideal) sample time.

In some embodiments, the error correction module 318 includes a corrective filter configured to update uncompensated digital output samples according to updated timing error values. In at least some embodiments, one or more N-bit digital word samples are stored by the error correction module 318, at least temporarily, and used in combination with the updated timing error values $t'_i$ to provide error-corrected digital signal output. For example, values of each $i-1^{st}$ corrected sample and $i+1^{st}$ uncorrected sample are temporarily stored and used to interpolate the expected $i^{th}$ sample, again using the updated timing error value $t'_i$ for the $i^{th}$ sample.

Figure 6:
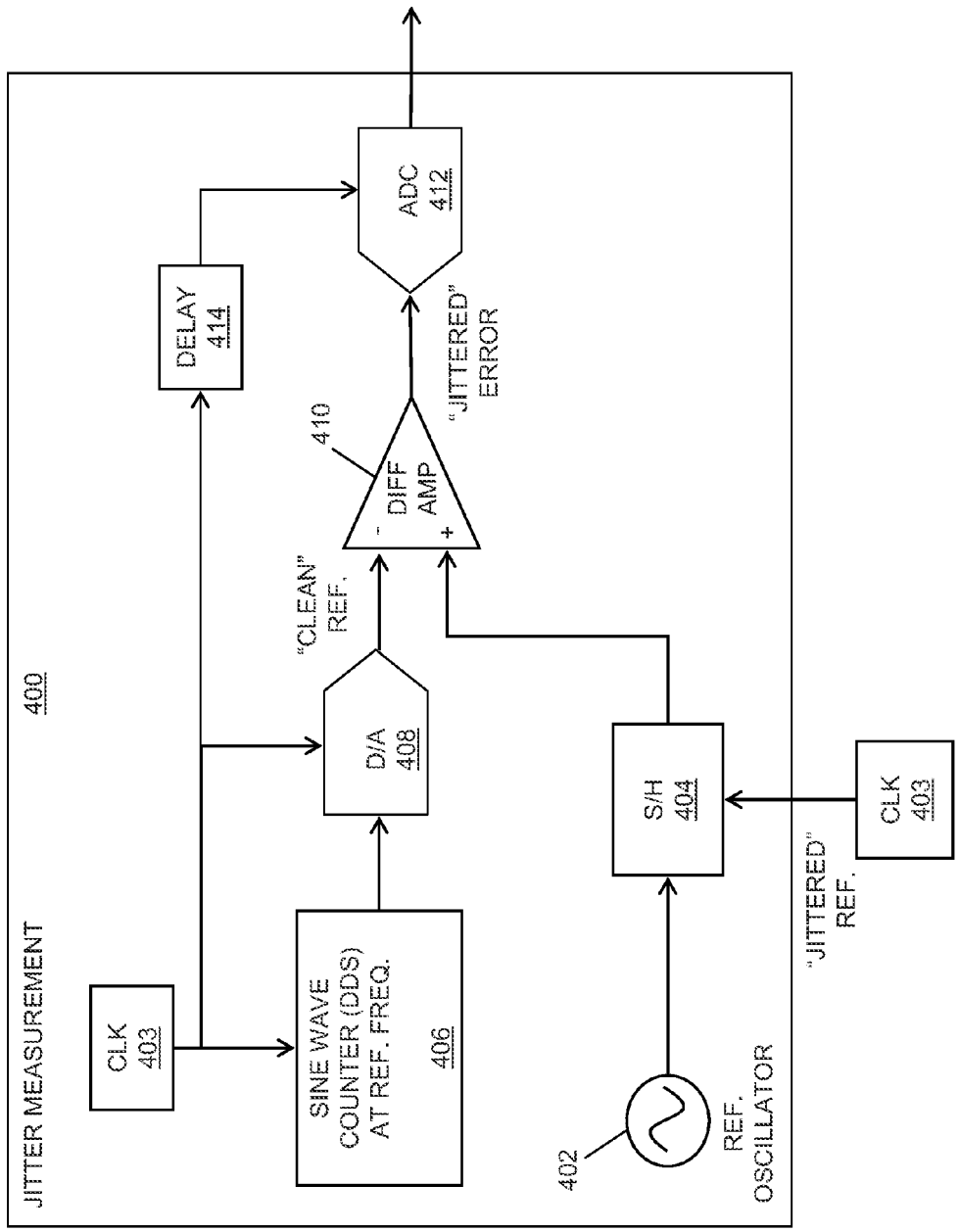
FIG. 6 illustrates a functional block diagram of a particular embodiment of a means for measuring jitter illustrated in FIG. 5.

FIG. 6 shows an expanded view of an example jitter error detection module 400 for measuring clock jitter. The jitter error detection module 400 includes a reference oscillator 402, a sample-and-hold module 404, a reference signal counter 406, a digital-to-analog converter 408, a difference module 410, and an ADC 412. Since the jitter error detection module 400 is described as being used in combination with an ADC, such as the uncompensated ADC 302 of FIG. 5, the ADC 412 within the jitter error detection module 400 is referred to as a "second" ADC 412. In at least some embodiments a delay module 414 is also provided.

To measure jitter of a high-speed clock signal, CLK, obtained from timing source 403, the output signal of the timing source is used to sample an output signal of the reference oscillator 402, REF. The reference oscillator 402 can be included within the jitter error detection module 400, or provided separately as an input to the jitter error detection module 400. In at least some embodiments, a period of REF is greater than a period of CLK, such that several "jittery" samples are obtained for each successive period of REF. It is desirable that the reference oscillator 402 have as high a frequency as possible, so that the clock jitter induces a relatively large and easily measured signal. However, the jitter level of the reference oscillator generally sets a limit on the degree of correction that can be obtained for clock jitter. In an example embodiment balancing these two requirements, a reference signal REF is chosen to be 200 MHz, for a 2 GHz high-speed clock signal. In the example embodiment, the high-speed clock signal is a square wave and the reference oscillator, is a sinusoid. There is no particular requirement that the high-speed clock signal and the reference signal be of similar of different waveforms.

The jittered sample of the reference oscillator signal could be directly digitized. However, because the jitter associated with the high-speed clock ($\Delta t$) is relatively small compared to a cycle time of the clock (T), and because the frequency of the reference oscillator signal (i.e., 200 MHz) is $\frac{1}{10}^{th}$ that of the frequency of the high-speed clock signal, the resultant portion of the sampled reference oscillator signal that is changed due to jitter ($\Delta A$) is less than about one part in 1,000 of the amplitude of the reference oscillator signal. Thus an ADC with greater than 10 ENOB (i.e., $2^{10}=1,024$) would be needed to sufficiently measure such a jitter error. This is a demanding requirement for an ADC operating at the 2 GHz rate of the CLK signal.

Beneficially, the approaches described herein do not require digitization of the full reference oscillator signal simplifying the requirements of the second ADC 412. Such approaches are sufficient, as only those portions of the sampled reference oscillator signal that are changed due to jitter are of interest. The unchanged portion of the signal is predictable for any given sample. As such, the jitter error detection module 400 determines the unjittered portion of the reference signal (the predictive portion) and effectively subtracts this value from the sample of the reference oscillator signal obtained using the high-speed clock signal, greatly simplifying digitization and determination of the signal of interest.

In operation, a discrete-time analog version of the reference oscillator signal is created without the impact of jitter. In some embodiments, a Look-Up Table (LUT) is loaded with the discrete digital values representing a waveform corresponding to the reference oscillator signal, e.g., a sinusoid. The sequence of values is incremented using the high-speed clock signal (e.g., 2 GHz) and output digital values provided to an input of a Digital-to-Analog Converter (D/A) 408, referred to as a "clean" version of the sampled reference oscillator signal. In this example the counter is loaded with appropriate values and configured to produce a 200 MHz sinusoid.

The output of the counter is constant during each cycle of the high-speed clock. Since the discrete-time output signal does not slew it is substantially immune to jitter-induced errors. In most circuits, a discrete time series is produced by a D/A that represents a desired waveform. Such waveforms can have errors due to timing jitter that are analogous to those induced by clock jitter in an ADC, where the time spacing of samples is important. However, the present invention produces one sample at a time, per the 2 GHz CLK, which is compared to the "jittery" sample that is sampled per the same CLK signal. The exact spacing of time samples does not impact the output of the D/A.

The "clean" version of the sampled reference oscillator signal is subtracted from the actual sampled version obtained from the analog reference oscillator signal including "jitter" and the result of that difference is referred to as a "jittered error." The jittered error can be amplified and digitized by the second ADC 412. In this example, the 200 MHz reference oscillator signal is sampled 10 times during each of its cycles.

In more detail, the sample-and-hold module 404 receives the periodic output signal (e.g., 200 MHz sinusoid) from the reference oscillator 402 and samples it in response to an input from the timing source 403. In the illustrative example, the samples are obtained upon rising edges of the high-speed, 2 GHz square wave signal, or clock (CLK). The high-speed clock signal is susceptible to clock jitter, such that periods of successive cycles of the clock vary according to clock jitter. The sample-and-hold module 404 provides a sampled and held output value corresponding to the value of the analog reference oscillator signal at or near the time of sampling. The sample-and-hold module 404 can be any suitable circuit capable of sampling and holding an analog value in response to the high-speed clock provided by the timing source 403. One such example includes a switched, tracking capacitor configured to accumulate charge corresponding to an amplitude of a signal being sampled. The capacitor is switched, or otherwise removed from the input at the time of sampling and configured to retain the tracked charge value corresponding to the amplitude of the input at the time of sampling.

In the illustrative example, the reference signal counter 406, referred to generally as a numerically controlled oscillator, stores a representation of at least one period of a waveform corresponding to the periodic reference signal (e.g., one period of a sine wave for a sine wave reference oscillator output, one period of a square wave for a square wave reference oscillator output, and so on). For example, the reference signal counter 406 includes a digital representation of one period of a sine wave. The stored representation can be sampled at an appropriate rate, according to the clock signal, such that an output period is obtained, representative of the reference oscillator signal, e.g., the 200 MHz sinusoid of the example embodiment. The reference signal counter 406 provides an updated numeric output (i.e., digital word) with each cycle of the high-speed clock, corresponding to a "clean" or otherwise un-jittered sample of the 200 MHz reference oscillator. In the example embodiment, numeric values corresponding to the stored representation of the sinusoid are provided, such that 10 samples span one period (i.e., form a 10:1 ratio between the high-speed clock and the reference oscillator signal). At least one technique for accomplishing such a numerically controlled oscillator is referred to as direct-digital-synthesis. The digital output words are converted to analog values by the digital-to-analog converter 408. Although a direct digital synthesis approach is described herein by way of example, any suitable means for providing substantially clean samples of the reference signal can be used.

The difference module 410 receives two inputs: (i) the sampled-and-held analog output value ("jittery" sample) from the sample-and-hold module 404 and (ii) the digital-to-analog converted value ("clean" sample) of the reference signal counter 406. The difference module 410 determines a difference between the two analog input values and provides an analog output representative of a measure of the difference. In some embodiments, the output is substantially equivalent to the difference. In other embodiments, the output is conditioned, for example, being amplified to provide a measure of the difference at a value above a system noise floor. The difference module 410 can be any suitable circuit configured to provide an output that is proportional to a difference of two input values. One such class of circuits includes differential amplifiers.

In at least some embodiments, the analog output of the difference module 410 is digitized by the second ADC 412. In the example embodiments, the high-speed clock is routed to the second ADC 412 through a delay module 414, to delay high-speed clock sufficiently to ensure that the difference is relatively stable at the time of sampling. The delay module 414, when provided, can simply be a suitable length of wire, circuit board trace, or transmission line. For each respective sample, the second ADC 412 provides an output that is a digital word corresponding to the difference in amplitude between the reference oscillator signal sampled by the jittery clock provided by the timing source 403 and the corresponding expected or ideal sample obtained from the reference signal, or frequency, counter 406. This digitized difference is representative of the amplitude variation (ΔA) contributable to jitter induced error in sampling the reference oscillator signal with the high-speed clock.

Figure 7:
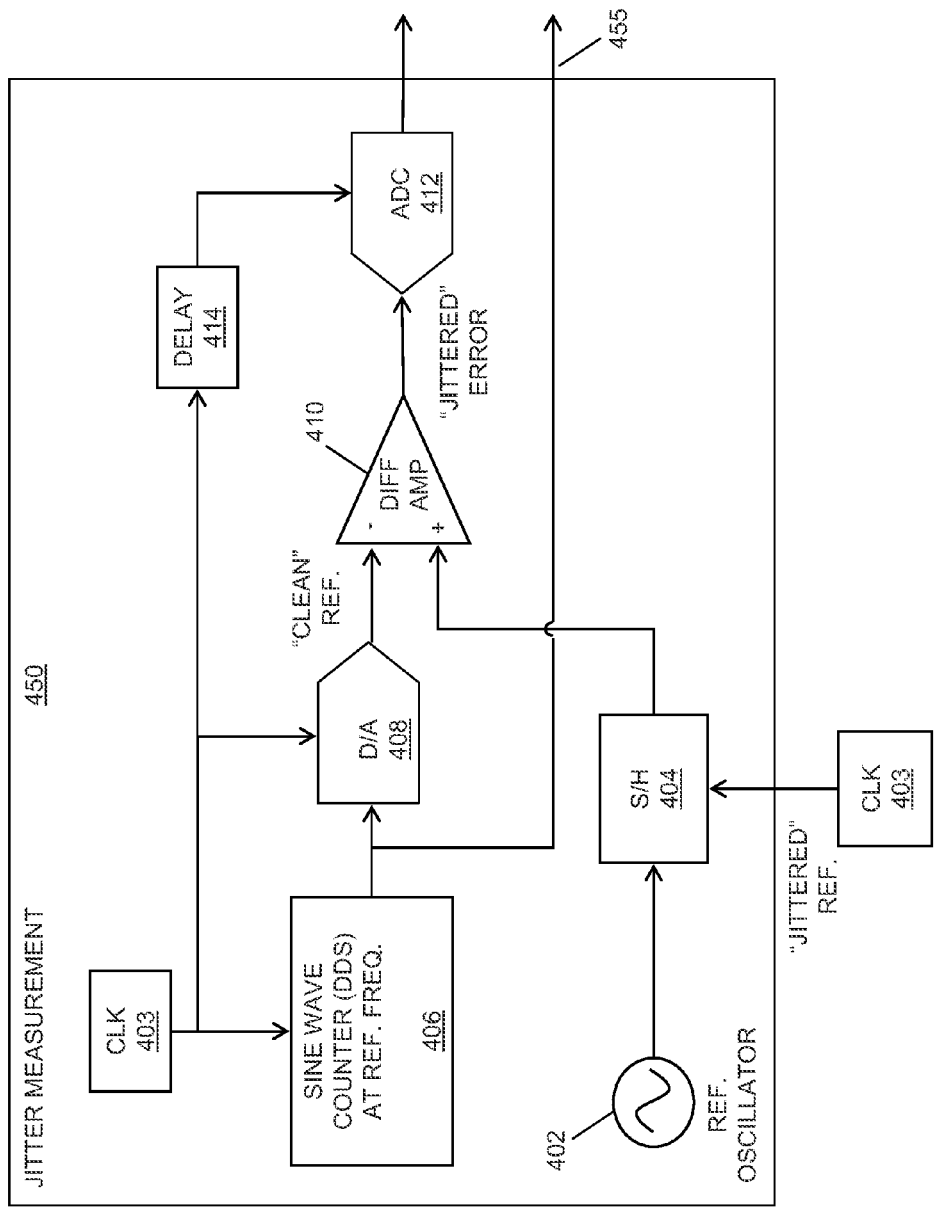
FIG. 7 illustrates a functional block diagram of an alternative embodiment of a means for measuring jitter illustrated in FIG. 5.

In some embodiments, referring next to FIG. 7, a jitter error detection module 450 provides a second output 455 along with each digitized amplitude error value. The second output 455 is indicative of where the sample falls within a period of the reference oscillator signal. As illustrated, the second output 455 can be the digital output of the signal counter. The second output can be provided to the timing error conversion module 316, allowing for determination of an actual sample time using more than simply an amplitude error as discussed above.

Figure 1A:
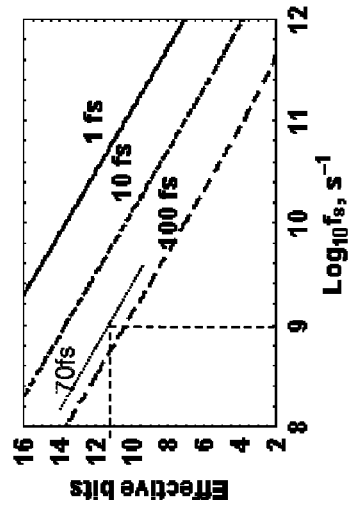
FIG. 1A and FIG. 1B illustrate ENOB values obtainable for ADCs as a function of their maximum sample rate and timing jitter.
Figure 1B:
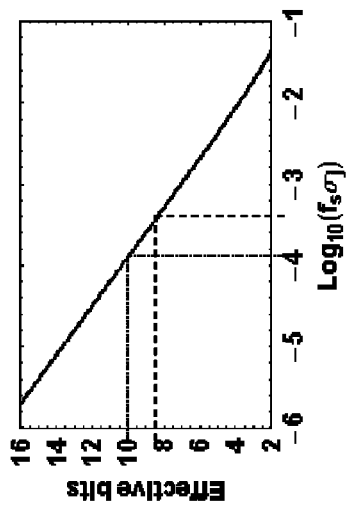

By way of example, a total jitter value of about 450 fs would limit ADC conversion to about 8.5 ENOB at a maximum input rate signal of about 1 GHz, as illustrated in FIG. 1A (8.5 ENOB for LOG(450 fs×1 GHz)=−3.4). Assuming an aperture jitter of 70 fs and ignoring clock jitter, the ENOB will be just over 11 bits, as illustrated in FIG. 1B. If clock jitter is reduced to 70 fs then the total jitter, determined as the Root-Sum-Square (RSS) of the various jitter components (e.g., square root of the sum of the squares of the clock jitter and the aperture jitter) is about 100 fs. Consequently, the corresponding ENOB for 70 fs clock jitter value is about 10.4 bits, which, for example, can be determined from FIG. 1A, for a value of LOG(70 fs×1 GHz)=−4.1. If the clock jitter is reduced slightly less, for example, by a factor of 4 to 110 fs then the total RSS jitter is about 120 fs, with a resulting ENOB of about 10.1 bits. Thus, in the illustrative example there would be a significant benefit to reducing the impact of clock jitter to about 120 fs with sharply diminishing returns, in this example, for reducing clock jitter any further.

To detect the jittered error, the combined dynamic range of the D/A 408 and the second ADC 412 must be sufficient so the error introduced by their quantization error is smaller than other errors and much smaller than the jittered error signal. Other errors are predominantly the jitter of the 200 MHz reference and the aperture jitter of the sampling circuit 404 (presumed to be 70 fs in the example). The reference jitter and aperture jitter are independent and combine in quadrature to about 120 fs. This 120 fs limit the level of correction that can be achieved by this example of the present invention. Reducing the effective clock jitter from 450 fs to around 120 fs adds two ENOB to the system. It is noted above that there would be diminishing returns for better correction due to the aperture jitter of the uncompensated ADC 302 (FIG. 5).

Additional ENOB recovery can be achieved if aperture jitter is small compared to corrected clock jitter or if the ratio of clock jitter to reference oscillator jitter is higher than in the example. These conditions are true for higher clocks shown in Table 2 above.

Table 4 shows example results for an illustrative example discussed herein. The first column contains a time reference, or sample reference number. The second column contains a sampled (at 2 GHz time index plus a pi/5 radian fixed offset) voltage levels for the 200 MHz "clean" reference (no jitter) assuming a signal ranging from −1 to 1 volt. The third column contains resulting samples of the reference oscillator voltage resulting from a high-speed 2 GHz clock with about 450 ps of timing error, as may be obtained by sampling according to a physically realizable timing source. The actual timing error ranges from about zero to more than 1 ps (3-sigma jitter). The fourth column shows the analog voltage difference resulting from the jitter (jitter-induced error). For the 200 MHz, 2 Volt peak-to-peak reference oscillator and a 2 GHz clock with 450 fs of jitter, the error signal amplitude ranges from about 170 μV to about 570 μV.

TABLE 4

Example of Jitter Voltage Levels

| TIME | CLEAN (V) | JITTERED (V) | DIFF (mV) |
|---|---|---|---|
| 0 | 0.58779 | 0.58824 | −0.46 |
| 1 | 0.95106 | 0.95123 | −0.17 |
| 2 | 0.95106 | 0.95088 | 0.17 |

TABLE 4-continued

Example of Jitter Voltage Levels

| TIME | CLEAN (V) | JITTERED (V) | DIFF (mV) |
|---|---|---|---|
| 3 | 0.58779 | 0.58733 | 0.46 |
| 4 | 0.00000 | −0.00057 | 0.57 |
| 5 | −0.58779 | −0.58824 | 0.46 |
| 6 | −0.95106 | −0.95123 | 0.17 |
| 7 | −0.95106 | −0.95088 | −0.17 |
| 8 | −0.58779 | −0.58733 | −0.46 |
| 9 | 0.00000 | 0.00057 | −0.57 |
| 10 | 0.58779 | 0.58824 | −0.46 |
| 11 | 0.95106 | 0.95123 | −0.17 |
| 12 | 0.95106 | 0.95088 | 0.17 |
| 13 | 0.58779 | 0.58733 | 0.46 |
| 14 | 0.00000 | −0.00057 | 0.57 |
| 15 | −0.58779 | −0.58824 | 0.46 |
| 16 | −0.95106 | −0.95123 | 0.17 |
| 17 | −0.95106 | −0.95088 | −0.17 |
| 18 | −0.58779 | −0.58733 | −0.46 |
| 19 | 0.00000 | 0.00057 | −0.57 |

Figure 8A:
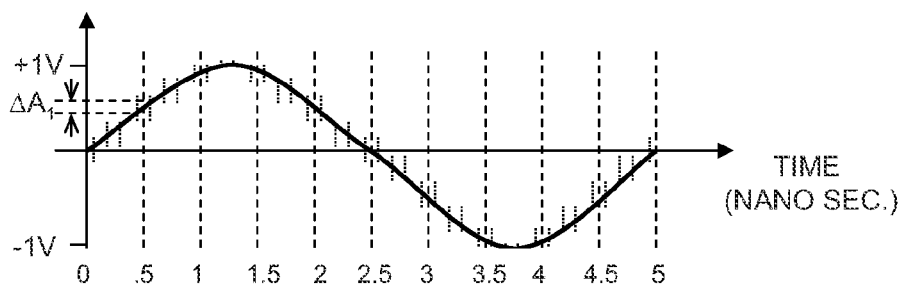
FIG. 8A illustrates an example of a time domain output of a reference oscillator of FIG. 6.
Figure 8B:
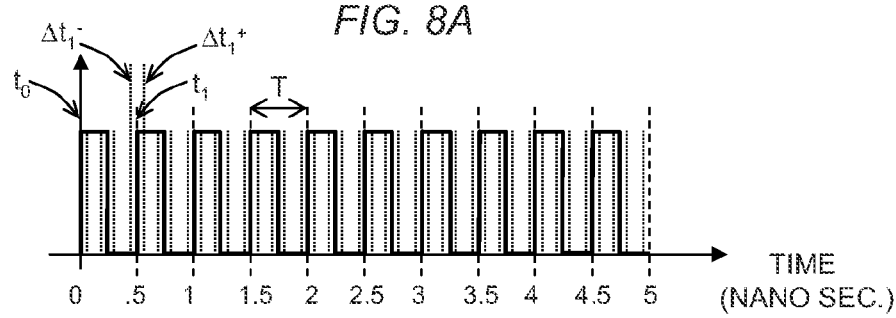
FIG. 8B illustrates an example of a high-speed clock output signal of a timing source of FIG. 6 or FIG. 7.

FIG. 8A illustrates an example of one period of an analog time domain output of a reference oscillator, such as the one described in the example of FIG. 6. In this example, the 200 MHz reference oscillator signal has a period of 5 nanoseconds and an amplitude that varies between +/−1 Volt. FIG. 8B illustrates an example of a high-speed clock output signal as may be obtained from a physically realizable timing source with a small amount of jitter present, such as the clock used to sample the reference oscillator voltage in the above example. The 2 GHz clock is rectangular with a period T of 0.5 nanoseconds. In this example, the sample-and-hold module 404 (FIG. 6) is configured to sample on a rising edge, e.g., $t_1$ of the $1^{st}$ clock cycle. Vertical dotted lines are shown on either side of each rising edge indicating the extent of variability in position of the rising edge due to jitter (e.g., a 1-sigma value) and identified as $t_1^-$ to the left of the ideal sample time and $t_1^+$ to the right of the ideal sample time. Dashed lines extend upward into FIG. 8A indicating the ideal, or un-jittered sampling times, e.g., $t_1$, whereas, the dotted lines are extended about each sampled value, the extent of the sampled signal between the dotted lines indicating an extent to the variability of a given sampled signal level ($\Delta A$). The extent of timing jitter $\Delta t$ can be determined as $t_1^+ - t_1^-$.

Figure 8C:
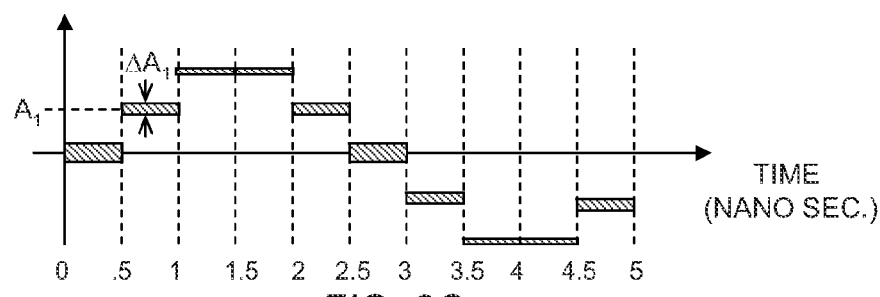
FIG. 8C illustrates an example of jitter-induced sampling uncertainty resulting from sampling the reference oscillator of FIG. 8A with the high-speed clock output signal of FIG. 8B.

Accordingly, the resulting sampled value will depend upon the amount of jitter in the clock signal (FIG. 8B) and the corresponding value of the analog input signal (FIG. 8A). The error in the sampled signal will depend further on the slew rate of the analog input signal. FIG. 8C illustrates an example of jitter-induced sampling uncertainty, e.g., $\Delta A_1$ resulting from sampling of the 200 MHz reference oscillator signal with the jitter uncertainty of the high-speed clock. The shaded regions within each sample suggest the range of variability in samples obtained due to the jitter error variability. Each actual sample would statistically reside somewhere within the shaded region, at least 68% for 1σ values.

Figure 8D:
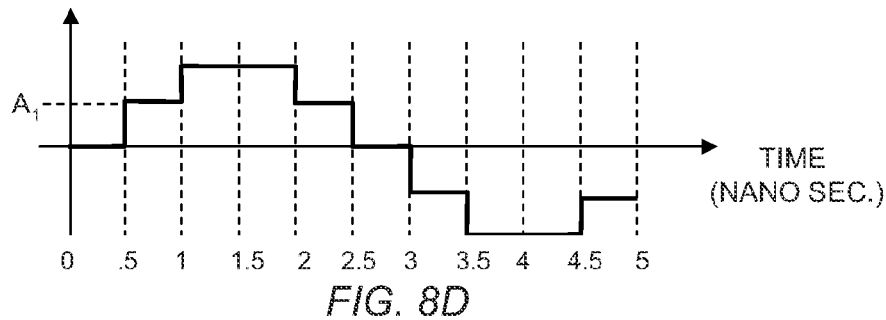
FIG. 8D illustrates an example of a digital-to-analog converted representation of a clean or ideal sampled version of the reference oscillator signal of FIG. 8A.

FIG. 8D illustrates an example of a digital-to-analog converted output of the reference signal counter 406. As described above, the signal counter 406 is configured to provide a digital output word corresponding to an un-jittered, or clean, sample of the 200 MHZ reference oscillator signal, which is converted to an analog value by the Digital-to-Analog (D/A) converter 408.

Figure 8E:
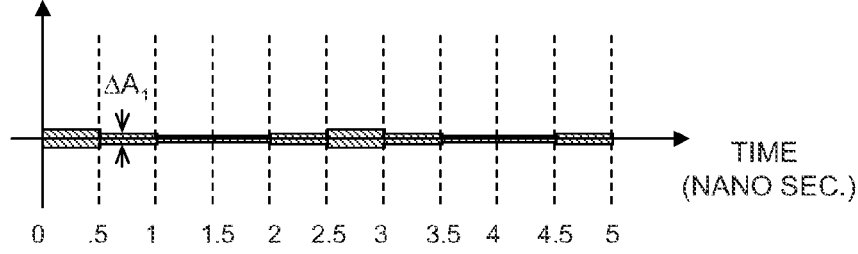
FIG. 8E illustrates an example of jitter-induced sampling error uncertainty as may be observed at an output of the differential amplifier of FIG. 6 or FIG. 7.

FIG. 8E illustrates an example of an analog representation of the uncertainty due to jitter error for each sample as may be observed at the output of the difference module 410 (FIG. 6). Effectively, the curve of FIG. 8E can be obtained from the difference between the curves of FIG. 8C and FIG. 8D. Once again, the actual jitter error value for any given sample will statistically fall somewhere within the respective shaded region at least about 68% of the time, depending on the position of the respective rising edge of the high-speed clock.

It is apparent from the illustrative example, that the effective bits of resolution due to jitter are increased to a level commensurate with the measurement error in the jitter rather than the control level. A 10-bit D/A has a least significant bit (LSB) of about 2 mV. Thus if this D/A were employed in FIG. 6, the jittered error signal would be sitting on top of up to 2 mV of known but uninteresting signal. In some embodiments, the difference module 410 also adds a small gain to the difference output signal ensuring that the output is far above other noises in the system. The second ADC 412 (FIG. 6) is selected to have a dynamic range sufficient to account for any residual signal above and beyond the jittered error signal, while also providing quantization noise smaller than the average jitter level. It is important to observe that the second ADC 412 is converting a sampled signal. Namely, the output of the difference module 410 is substantially stable during each sample period, such that clock jitter does not affect operation of the second ADC 412.

It is desirable that the uncertainty in the jitter level be a small fraction of the average jitter level. If ADC2 has 4 ENOB then its Least-Significant Bit (LSB) would be less than half the typical jitter error signal. Its quantization noise is determined as the LSB divided by the square root of 12 and is bounded to be not greater than half of an LSB. So in this example a D/A with 10 bits and an ADC2 of 4 effective bits can measure the error due to the high-speed clock, only limited by the jitter in the 200 MHz signal. Other balances between the D/A and the ADC2 respective dynamic ranges will work as well.

Figure 9:
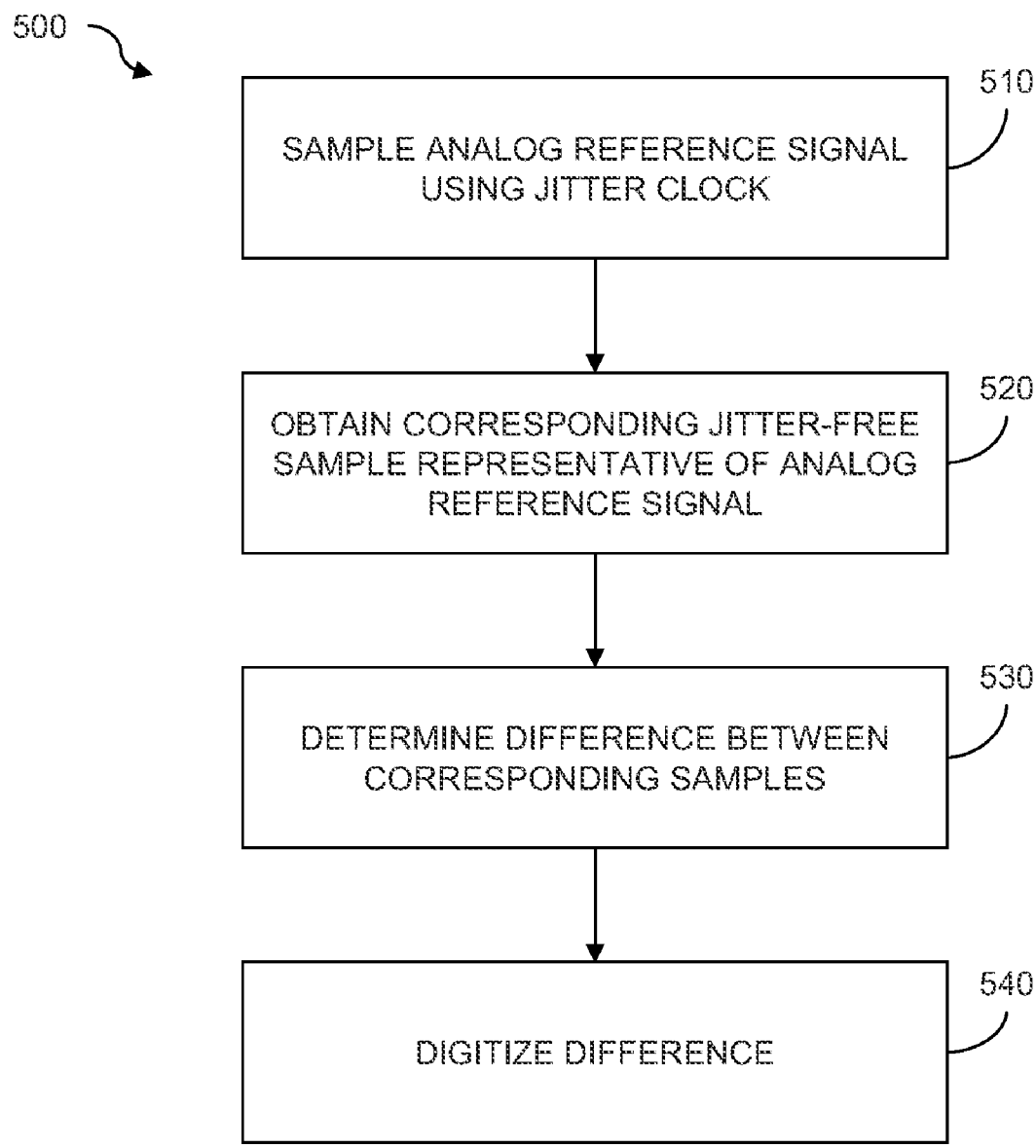
FIG. 9 illustrates a flowchart detailing an example operation of a particular embodiment of a process for determining jitter-related error of a high-speed clock signal.

A flowchart detailing an example operation of a particular embodiment of a process 500 for clock jitter-induced error is illustrated in FIG. 9. For each cycle of a clock signal, a first sample of a periodic analog reference signal is obtained at 510 using jitter clock. The first sample includes a sample error resulting at least in part from timing jitter of the clock signal. A second sample corresponding to a jitter-free discrete-time representation of the periodic analog reference signal is obtained for each respective cycle of the clock signal at 520. For each respective clock cycle, a difference between the first and second samples, each corresponding to the same respective cycle of the clock signal is determined at 530. The difference is converted to a digital representation of the difference at 540, which is indicative of jitter-induced error of the respective cycle of the clock signal.

Figure 10:
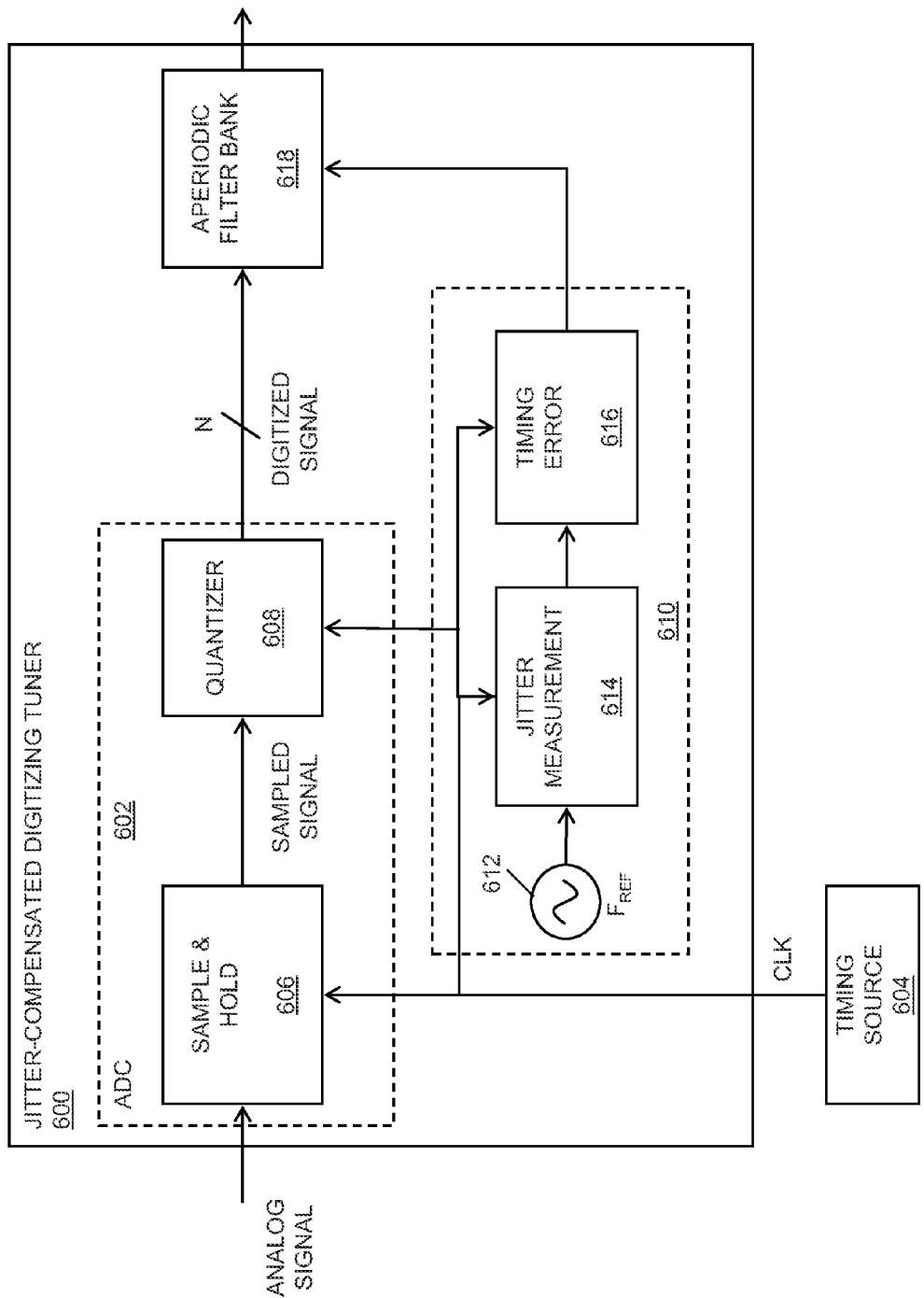
FIG. 10 illustrates a functional block diagram of a particular embodiment of a jitter-compensated ADC that includes an aperiodic filter bank.

If the ADC is part of channelizer in a receiver (e.g., the filter bank 208 of FIG. 4) or virtually any other system, it is possible to transmit the N corrected bits to a channelizer function. In a second embodiment of the present invention the interpolation filter and a Fast Fourier Transform (FFT)/channelizer function are combined into a single function. One such example is shown in FIG. 10. In this embodiment an aperiodic filter bank replaces the interpolator/reconstructer block 318 (FIG. 5). The aperiodic filter bank provides amplitude and phase at one or more frequencies of interest. It can be based on digital heterodyne, Lomb-Welch periodograms, or other fitting techniques for extracting amplitude and/or phase at user selected frequencies.

FIG. 10 illustrates a functional block diagram of a particular embodiment of a jitter-compensating digitizing tuner 600 that includes an aperiodic filter bank 618. The jitter-compensating digitizing tuner 600 can be similar to the embodiment described in relation to FIG. 5, at least in that it includes a typical (i.e., uncompensated) ADC 602 that includes a sample-and-hold module 606 and quantizer 608 configured to sample an analog signal responsive to a high-speed clock signal provided by a timing source 604. The jitter-compensating digitizing tuner 600 also includes a jitter error detection module 610 configured to determine a measure of the timing of the high-speed clock signal (e.g., of the actual clock pulses). The jitter error detection module 610, in turn, includes a reference frequency oscillator 612, a jitter error measurement module 614, and a timing error conversion module 616.

In the example embodiment, the jitter error detection module 610 receives the high-speed clock signal from the timing source 604 and is configured to generate an "error signal" related to the actual timing employed. Instead of correcting or otherwise reconstructing the digital output of the ADC directly as described above in reference to FIG. 5; however, the uncompensated digital representation of the analog input signal is provided to the aperiodic filter bank 618, together with the error signal indicative of the actual timing of the high-speed clock signal. The aperiodic filter bank 618 is configured to compensate for any error resulting from timing of the high-speed clock signal. For example, the aperiodic filter bank 618 can make adjustments to non-uniform filter spacing to accommodate the actual, non-uniform sample times used to sample the analog input signal.

If a Discrete Fourier Transform (DFT) or FFT were used to compute frequency information the clock jitter would cause errors. The FFT takes as input S samples and returns amplitudes and phase information at S frequency locations that are evenly spaced in frequency. Narrow band signals that fall between the frequency centers are detected on each of the adjacent channels, but at lower signal to noise than had the signal been centered on a single channel. Using the correct timing information in the aperiodic filter bank yields correct results, at least to the fidelity of the timing knowledge.

In more detail, the jitter-compensating digitizing tuner 600 can be tuned to any frequency to center signals of interest. For example, it can be used to search for a single frequency or any number of signals, with processing power sized to the number of signals of interest. The DFT/FFT can compute a highest frequency without aliasing that is half the average sample rate and can resolve two frequencies separated by more than the reciprocal length of time signals are collected.

The jitter-compensating digitizing tuner 600 can also resolve frequencies that are more closely spaced and can report a higher maximum frequency without aliasing (since some time samples are more closely spaced than the average). In another embodiment, the timing signal is intentionally made non-periodic so as to optimize the frequency resolution and/or maximum frequency computed without aliasing.

Figure 11:
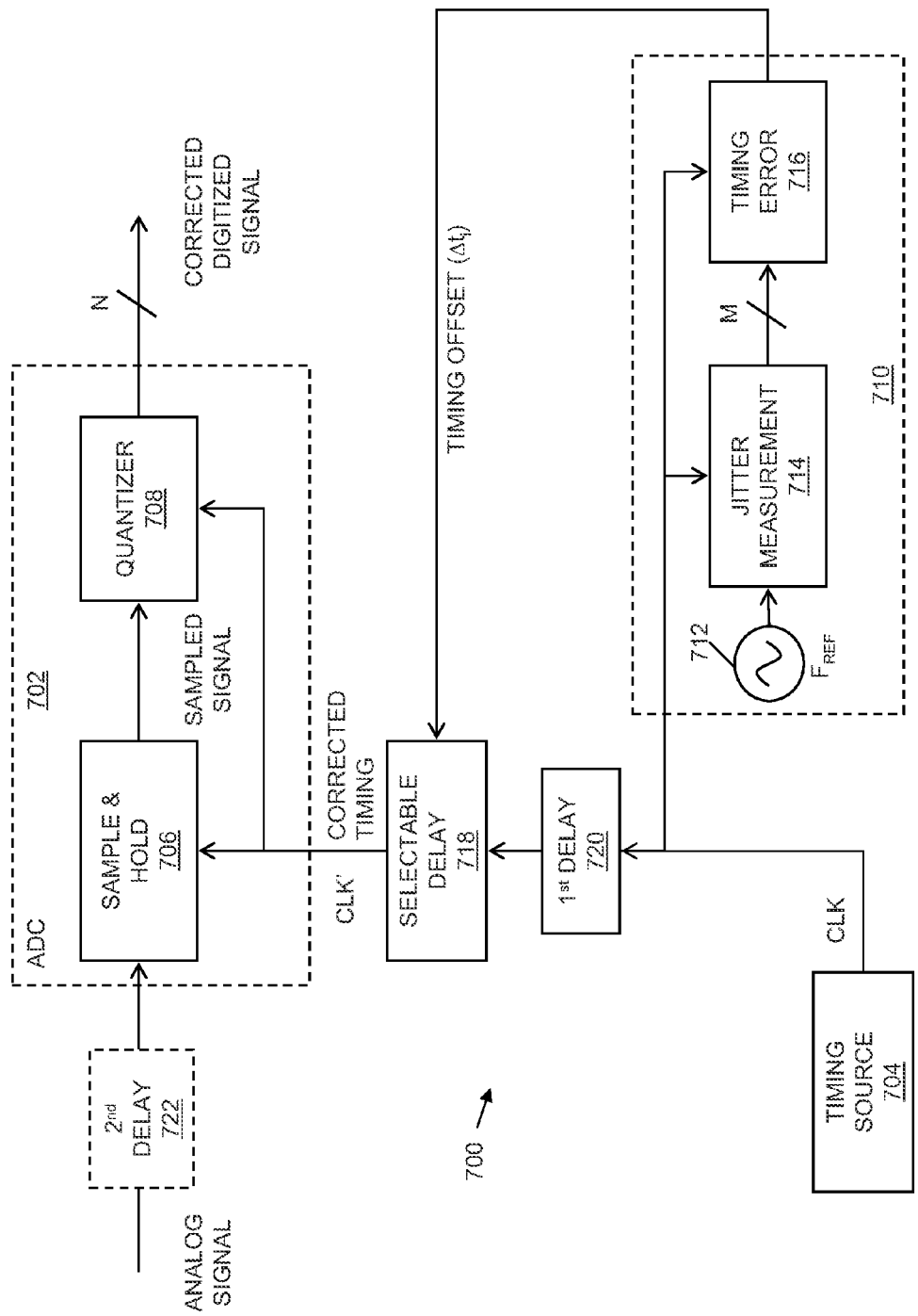
FIG. 11 illustrates a functional block diagram of an alternative embodiment of a jitter-compensated ADC that includes means for compensating the high-speed clock.

In yet another embodiment, shown in FIG. 11, a timing error detection and correction feature 700 measures clock-induced jitter error in a high-speed timing, or clock (CLK), signal and corrects or otherwise adjusts the clock signal (CLK') to effectively and substantially remove the clock jitter before the CLK' signal is applied to a conventional, uncompensated ADC 702.

In more detail, the ADC 702 can be similar to the embodiment described in relation to FIG. 5, at least in that it includes a typical (i.e., uncompensated) ADC 702 that includes a sample-and-hold module 706 and quantizer 708 configured to sample an analog signal responsive to a high-speed clock signal provided by a timing source 704. The timing error detection and correction feature 700 includes a jitter error detection module 710, for example, similar to the jitter error detection module described in relation to FIG. 5. The jitter error detection module 710 is configured to determine a measure of the timing of the high-speed clock signal (e.g., of the actual clock pulses). The jitter error detection module 710, in turn, includes a reference frequency oscillator 712, a jitter error measurement module 714, and a timing error conversion module 716. In the example embodiment, the jitter error detection module 710 receives the high-speed clock signal from the timing source 704 and is configured to generate an "error signal" related to the actual timing employed.

Instead of correcting or otherwise reconstructing the digital output of the ADC directly as described above in reference to FIG. 5; however, the timing error detection and correction feature 700 includes a selective delay module 718 coupled between the timing source 704 and the uncompensated ADC 702. The selective delay module 718 is configured to compensate for timing error resulting from jitter of the high-speed clock signal. Preferably, such timing correction is accomplished for each cycle of the high-speed clock signal, with the timing correction responsive to the clock jitter error associated with each respective cycle. Thus, the selective delay module 718 can make adjustments to the high-speed clock signal to correct for non-uniform clock cycle periods. For example, the selective delay module 718 can add delay to the high-speed clock signal for clock cycles, such as the pulse train of FIG. 8B, having a rising edge that occurs too soon, due to clock jitter (correcting an otherwise compressed clock cycle period). Likewise, the selective delay module 718 can add little or no delay from the high-speed clock signal for clock cycles having a rising edge that occurs too late, due to clock jitter (correcting an otherwise expanded clock cycle period).

The selective delay module 718 can be any suitable module configured to provide different selectable timing delays to the high-speed clock signal. In some examples, the selective delay module 718 can include selectable analog delays, such as different lengths of wire, circuit board trace, or transmission line. The selectable analog delays can be selectively switched into the high-speed clock signal path responsive to the measured timing error value. The number of delay elements provided and their respective delay values are selectable based on expected extent of clock jitter (e.g., max jitter error $\Delta t_{max}$) and/or desired resolution/precision.

In some embodiments, the multiple switchable delay elements of the selective delay module 718 can be uniform in duration. For example, in one embodiment, the delay module 718 includes four delay elements of about 100 fs each, configured to provide between 0 and 400 fs of delay, in 100 fs increments. Alternatively or in addition, the multiple switchable delay elements of the selective delay module 718 can vary in duration. For example, in another embodiment, the delay module 718 includes four delay elements (in serial) of 400 fs, 200 fs, 100 fs, and 50 fs, configured to provide between 0 and 750 fs of delay in 50 fs increments.

In some embodiments, a first delay 720 is also coupled between the timing source 704 and the uncompensated ADC 702. The first delay 720 can be a fixed delay or a variable delay. In the illustrative example, the first delay 720 is a fixed delay coupled between the timing source 704 and the selectable delay line 718. The delay value provided by the first delay 720 can be sufficient to delay a rising edge of a particular clock cycle sufficiently to allow time for determination of a corresponding timing offset by the timing error detection module 710 and for configuration of the selectable delay module 718 in response to the timing offset value. Accordingly, a corrected timing output of the selectable delay 718 provides a stable clock cycle-to-cycle period. The delay configuration results in a relative offset between the CLK signal of the timing source 704 and the corrected CLK' signal.

In some embodiments, a second delay 722 is coupled between the analog input signal and the uncompensated ADC 702. The second delay 722 can be a fixed delay or a variable delay. In the illustrative example, the second delay 722 is a fixed delay of duration greater than the first delay 720, when present.

One or more of the various modules describe herein, such as the jitter error measurement modules, timing error detection modules, and error correction modules may represent or include any form of processing component, including general purpose computers, dedicated microprocessors, or other processing devices capable of processing electronic information. Examples of processors include digital signal processors (DSPs), application-specific integrated circuits (ASICs), field-programmable gate arrays (FPGAs), and any other suitable specific- or general-purpose processors. Although the examples described herein relate to particular embodiments of the modules, each module may include a respective processing component, or more generally, any suitable number of processors.

Any of the modules may include memories, for example, storing related processing values. Any such memories may include any collection and arrangement of volatile or non-volatile components suitable for storing data. For example, any such memories may include random access memory (RAM) devices, read-only memory (ROM) devices, magnetic storage devices, optical storage devices, or any other suitable data storage devices. In particular embodiments, any such memories may represent, in part, computer-readable storage media on which computer instructions and/or logic are encoded. In such embodiments, some or all the described functionality of the various modules, e.g., the jitter error measurement modules, timing error detection modules, and error correction modules may be provided by a processor (not shown) executing the instructions encoded on the described media.

Figure 2:
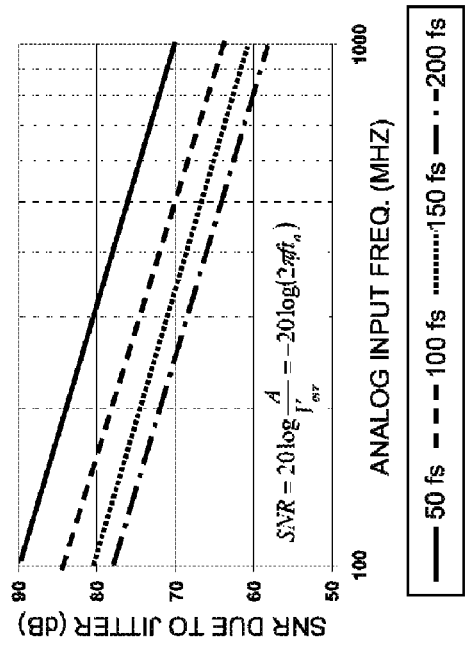
FIG. 2 illustrates variation of ADC signal-to-noise performance responsive to clock jitter.
Figure 3:
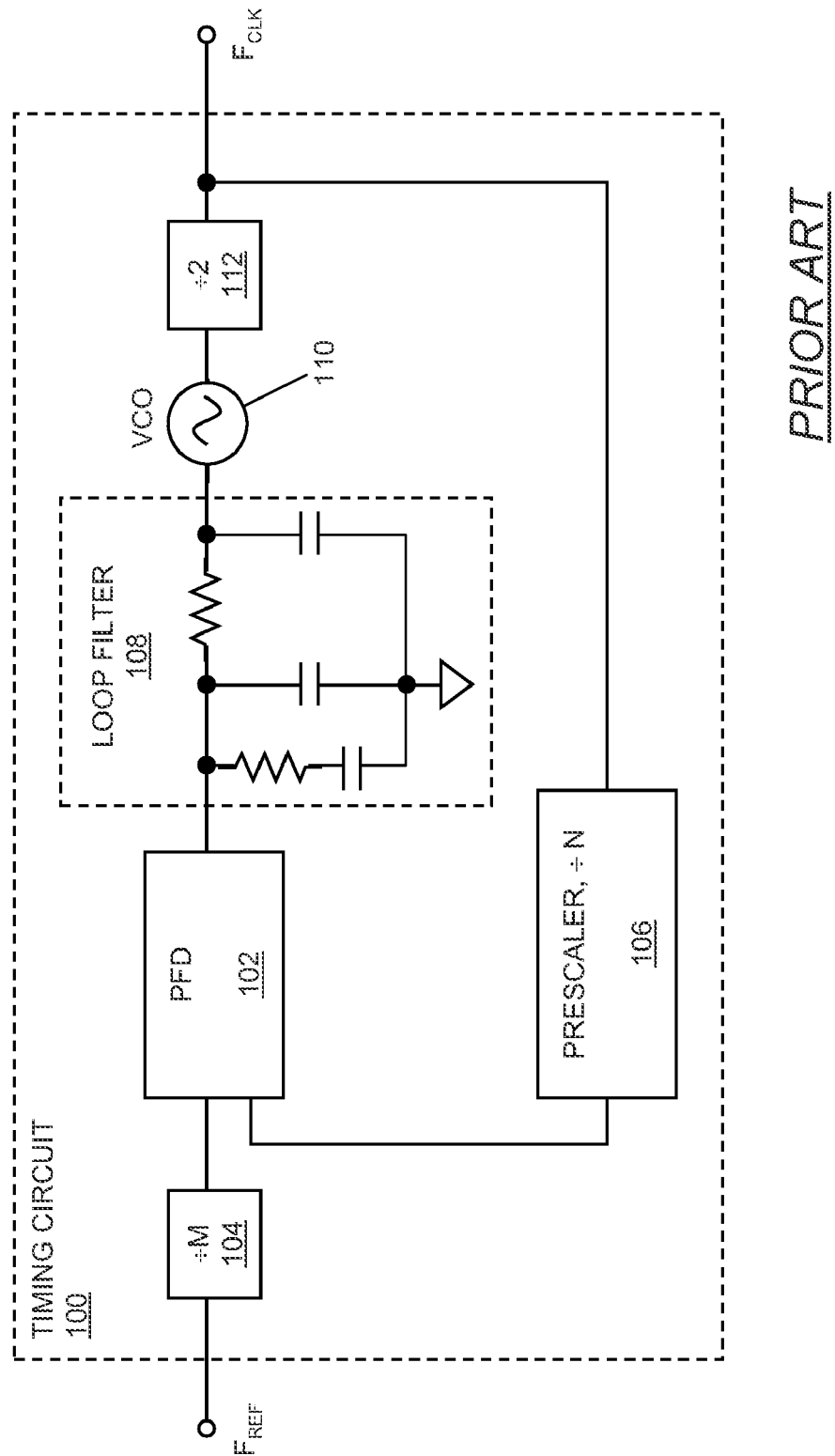
FIG. 3 illustrates a schematic diagram of an example of one type of typical timing circuit.

In general, each of the modules, e.g., jitter error measurement modules 314 (FIG. 5), 614 (FIG. 10), 714 (FIG. 11); timing error conversion modules 316 (FIG. 5), 616 (FIG. 10), 716 (FIG. 11); error correction modules 318 (FIG. 5); FFT/filter bank modules 208 (FIG. 2); aperiodic filter bank modules 618 (FIG. 10); and selectable delay module 718 (FIG. 11), may represent any appropriate combination of hardware and/or software suitable to provide the described functionality. Additionally, any two or more of the modules may represent or include common elements.

The above-described systems and processes can be implemented in digital electronic circuitry, in computer hardware, firmware, and/or software. The implementation can be as a computer program product (i.e., a computer program tangibly embodied in an information carrier). The implementation can, for example, be in a machine-readable storage device and/or in a propagated signal, for execution by, or to control the operation of, data processing apparatus. The implementation can, for example, be a programmable processor, a computer, and/or multiple computers.

A computer program can be written in any form of programming language, including compiled and/or interpreted languages, and the computer program can be deployed in any form, including as a stand-alone program or as a subroutine, element, and/or other unit suitable for use in a computing environment. A computer program can be deployed to be executed on one computer or on multiple computers at one site.

Method steps can be performed by one or more programmable processors executing a computer program to perform functions of the invention by operating on input data and generating output. Method steps can also be performed by and an apparatus can be implemented as special purpose logic circuitry. The circuitry can, for example, be a FPGA (field programmable gate array) and/or an ASIC (application-specific integrated circuit). Modules, subroutines, and software agents can refer to portions of the computer program, the processor, the special circuitry, software, and/or hardware that implements that functionality.

Processors suitable for the execution of a computer program include, by way of example, both general and special purpose microprocessors, and any one or more processors of any kind of digital computer. Generally, a processor receives instructions and data from a read-only memory or a random access memory or both. The essential elements of a computer are a processor for executing instructions and one or more memory devices for storing instructions and data. Generally, a computer can include, can be operatively coupled to receive data from and/or transfer data to one or more mass storage devices for storing data (e.g., magnetic, magneto-optical disks, or optical disks).

Data transmission and instructions can also occur over a communications network. Information carriers suitable for embodying computer program instructions and data include all forms of non-volatile memory, including by way of example semiconductor memory devices. The information carriers can, for example, be EPROM, EEPROM, flash memory devices, magnetic disks, internal hard disks, removable disks, magneto-optical disks, CD-ROM, and/or DVD-ROM disks. The processor and the memory can be supplemented by, and/or incorporated in special purpose logic circuitry.

To provide for interaction with a user, the above described techniques can be implemented on a computing device having a display device. The display device can, for example, be a cathode ray tube (CRT) and/or a liquid crystal display (LCD) monitor, and/or a light emitting diode (LED) monitor. The interaction with a user can, for example, be a display of information to the user and a keyboard and a pointing device (e.g., a mouse or a trackball) by which the user can provide input to the computing device (e.g., interact with a user interface element). Other kinds of devices can be used to provide for interaction with a user. Other devices can, for example, be feedback provided to the user in any form of sensory feedback (e.g., visual feedback, auditory feedback, or tactile feedback). Input from the user can, for example, be received in any form, including acoustic, speech, and/or tactile input.

The above described techniques can be implemented in a distributed computing system that includes a back-end component. The back-end component can, for example, be a data server, a middleware component, and/or an application server. The above described techniques can be implemented in a distributing computing system that includes a front-end component. The front-end component can, for example, be a client computing device having a graphical user interface, a Web browser through which a user can interact with an example implementation, and/or other graphical user interfaces for a transmitting device. The components of the system can be interconnected by any form or medium of digital data communication (e.g., a communication network). Examples of communication networks include a local area network (LAN), a wide area network (WAN), the Internet, wired networks, and/or wireless networks.

The system can include clients and servers. A client and a server are generally remote from each other and typically interact through a communication network. The relationship of client and server arises by virtue of computer programs running on the respective computing devices and having a client-server relationship to each other.

Communication networks can include packet-based networks, which can include, for example, the Internet, a carrier interne protocol (IP) network (e.g., local area network (LAN), wide area network (WAN), campus area network (CAN), metropolitan area network (MAN), home area network (HAN)), a private IP network, an IP private branch exchange (IPBX), a wireless network (e.g., radio access network (RAN), 802.11 network, 802.16 network, general packet radio service (GPRS) network, HiperLAN), and/or other packet-based networks. Circuit-based networks can include, for example, the public switched telephone network (PSTN), a private branch exchange (PBX), a wireless network (e.g., RAN, bluetooth, code-division multiple access (CDMA) network, time division multiple access (TDMA) network, global system for mobile communications (GSM) network), and/or other circuit-based networks.

The computing device can include, for example, a computer, a computer with a browser device, a telephone, an IP phone, a mobile device (e.g., cellular phone, personal digital assistant (PDA) device, laptop computer, electronic mail device), and/or other communication devices. The browser device includes, for example, a computer (e.g., desktop computer, laptop computer) with a World Wide Web browser (e.g., Microsoft® Internet Explorer® available from Microsoft Corporation, Mozilla® Firefox available from Mozilla Corporation). The mobile computing device includes, for example, a Blackberry®.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. A method for reducing clock jitter-induced error, comprising:
   obtaining at each cycle of a clock signal, a first sample of a periodic analog reference signal, the first sample including a sample error resulting at least in part from jitter-induced timing error of the clock signal;
   obtaining for each respective cycle of the clock signal a second sample of a discrete-time analog representation of the periodic analog reference signal, the second sample being substantially unsusceptible to jitter-induced timing error of the clock signal, each of the first and second samples corresponding to the same respective cycle of the clock signal;
   determining for each cycle of the clock signal a respective difference between each of the first and second samples, the difference indicative of timing error of the respective cycle of the clock signal; and
   converting the difference to a digital representation.

2. The method of claim 1, further comprising converting for each respective cycle of the clock signal the digital representation of the difference to a timing correction value that when applied to the respective cycle of the clock signal substantially removes the timing error.

3. The method of claim 2, wherein converting the digital representation of the difference to a timing correction value comprises associating a timing jitter estimate with the digital representation of the difference according to a predetermined relationship.

4. The method of claim 2, further comprising interpolating output samples of an analog-to-digital converter according to the timing correction value, such that interpolated output samples correspond to corrected samples substantially without clock jitter.

5. The method of claim 1, wherein a ratio of a period of the clock signal to a period of the periodic analog reference signal is at least two.

6. The method of claim 5, wherein a ratio of a period of the clock signal to a period of the periodic analog reference signal is at least about 10.

7. The method of claim 2, further comprising:
   delaying the clock signal; and
   adjusting the delayed clock signal, such that successive cycles of the clock signal are offset by respective timing correction values;
   supplying the adjusted, delayed clock signal to a timing input of an analog-to-digital converter.

8. The method of claim 7, wherein adjusting successive clock cycles of the clock signal comprises:
   choosing selectable delays corresponding to the respective timing correction values; and
   delaying the clock signal according to the chosen delay.

9. The method of claim 1, wherein obtaining the second sample comprises retrieving the second sample from a lookup table.

10. The method of claim 1, wherein obtaining the first sample of the periodic analog reference signal comprises sampling and holding the periodic analog reference signal at each cycle of the clock signal.

11. An apparatus for reducing clock jitter-induced error, comprising:
   a sample-and-hold module configured to receive a periodic analog reference signal and a clock signal having periods of successive clock cycles that vary according to clock jitter, the sample-and-hold module configured to provide an output sampled-and-held output signal;
   a numerically controlled oscillator configured to receive the same clock signal and to provide for each cycle of the clock signal a respective digital representation of the periodic analog reference signal;
   a digital-to-analog converter in electrical communication with the numerically controlled oscillator, the digital-to-analog converter configured to provide a respective analog output value responsive to each respective digital representation of the periodic analog reference signal;
   a difference module in electrical communication with the sample-and-hold module and the digital-to-analog converter, the difference module configured to determine for each cycle of the clock signal, a respective difference between each of the sampled-and-held output signal and the analog output value; and
   an analog-to-digital converter in electrical communication with the difference module and the clock signal, the analog-to-digital converter configured to convert each respective difference to a digital representation of the difference indicative of timing error of the respective cycle of the clock signal.

12. The apparatus of claim 11, further comprising a delay module in electrical communication between the analog-to-digital converter and the clock signal.

13. The apparatus of claim 11, further comprising a timing error conversion module in electrical communication with the analog-to-digital converter and configured with a predetermined relationship to associate a timing jitter estimate with the digital representation of the difference.

14. The apparatus of claim 13, further comprising:
   a high-fidelity analog-to-digital converter configured to receive an analog signal and the clock signal, and to output a digital representation of the received analog signal; and
   a signal reconstruction module in electrical communication with the high-fidelity analog-to-digital converter and the timing error conversion module, the signal reconstruction module configured to receive the digital representation of the received analog signal and the digital representation of the difference and to provide a corrected digital representation of the received analog signal.

15. The apparatus of claim 14, wherein the signal reconstruction module comprises an interpolator.

16. The apparatus of claim 13, further comprising a selectable delay module in electrical communication with the timing error conversion module and the clock signal, the selectable delay module configured to add a variable timing delay to the clock signal according to the timing jitter estimate.

17. The apparatus of claim 11, further comprising a fixed delay in electrical communication between the selectable delay module and the clock signal.

18. The apparatus of claim 11, wherein the difference module comprises a differential amplifier.

19. The apparatus of claim 11, wherein the numerically controlled oscillator comprises a memory loaded with discrete digital values representing the periodic analog reference signal and a memory pointer configured to be incremented by the clock signal.

20. An apparatus for reducing clock jitter-induced error, comprising:
   means for obtaining at each cycle of a clock signal, a first sample of a periodic analog reference signal, the first sample including a sample error resulting at least in part from jitter-induced timing error of the clock signal;
   means for obtaining for each respective cycle of the clock signal a second sample of a discrete-time analog representation of the periodic analog reference signal, the second sample being substantially unsusceptible to jitter-induced timing error of the clock signal, each of the first and second samples corresponding to the same respective cycle of the clock signal;
   means for determining for each cycle of the clock signal a respective difference between each of the first and second samples; and
   means for converting the difference to a digital representation of the difference indicative of timing error of the respective cycle of the clock signal, the sample error.

\* \* \* \* \*